United States Patent [19]

Kawaguchi et al.

[11] Patent Number: 4,905,183
[45] Date of Patent: Feb. 27, 1990

[54] PATTERN GENERATOR HAVING PLURAL PATTERN GENERATING UNITS EXECUTING INSTRUCTIONS IN PARALLEL

[75] Inventors: Ikuo Kawaguchi, Tokyo; Shuji Kikuchi; Chisato Hamabe, both of Yokohama, all of Japan

[73] Assignee: Hitachi, Ltd., Tokyo, Japan

[21] Appl. No.: 78,993

[22] Filed: Jul. 29, 1987

[30] Foreign Application Priority Data

Jul. 30, 1986 [JP] Japan ................................ 61-177548
Jan. 30, 1987 [JP] Japan ................................ 62-18310

[51] Int. Cl.⁴ ........................ G06F 15/16; G06F 11/00
[52] U.S. Cl. ........................................ 364/900; 371/27;
  364/931.4; 364/931.41; 364/946.2; 364/948.3
[58] Field of Search ...................... 371/27, 20, 21, 25;
  364/200 MS File, 900 MS File

[56] References Cited

U.S. PATENT DOCUMENTS

| | | | |
|---|---|---|---|
| 4,369,511 | 1/1983 | Kimura et al. | 371/21 |
| 4,460,999 | 7/1984 | Schmidt | 371/21 |
| 4,555,663 | 11/1985 | Shimizu | 371/27 |
| 4,639,919 | 1/1987 | Chang et al. | 371/27 |
| 4,670,879 | 6/1987 | Okino | 371/27 |
| 4,744,047 | 5/1988 | Okamoto et al. | 364/900 |
| 4,759,021 | 7/1988 | Kawaguchi et al. | 371/27 |
| 4,788,684 | 11/1988 | Kawaguchi et al. | 371/21 |

FOREIGN PATENT DOCUMENTS

| | | |
|---|---|---|
| 54-12657 | 1/1979 | Japan . |
| 54-36055 | 11/1979 | Japan . |
| 57-52679 | 11/1982 | Japan . |

Primary Examiner—Raulfe B. Zache
Assistant Examiner—Florin Munteanu-Ramnic
Attorney, Agent, or Firm—Antonelli, Terry & Wands

[57] ABSTRACT

A pattern generator permitting to output patterns at high speed and having an operating function, which is suitable for generating test patterns for memory ICs. Although it was known heretofore to increase the operating speed by operating a plurality of pattern generators, for which patterns were generated from memories, in which patterns were previously stored, in parallel, it was not possible to operate pattern generators having an operating function in parallel. A method, by which the order of execution of operation processing instructions is assigned to each of the pattern generators and operation processing instructions are accumulated and allows patterns to be generated at high speed by means of a pattern generator having an operating function. Specifically, the operating processing instructions are grouped and rearranged such that all the pattern generators execute instructions in parallel.

5 Claims, 16 Drawing Sheets

FIG. 7
(PRIOR ART)
N: NUMBER OF ALPGS
A: OPERATING REGISTER
R: CONSTANT DATA REGISTER
∗: MULTIPLICATION
(a)
```
A ← A
A ← R
A ← A ± 1
```
(b)
```
A ← A
A ← R ± (n-1)
A ← A ± n
```
WHERE n IS AN INTEGER
SATISFYING $1 \leq n \leq N$
(c)
```
A ← A
A ← R
A ← A ± 1
A ← A ± R
```
(d)
$A \leftarrow A \pm n_1 * R \pm n_2$
$A \leftarrow \pm n_1 * R \pm n_2$
WHERE $n_1$ AND $n_2$ ARE
INTEGERS SATISFYING
$0 \leq n_1 \leq N$
$0 \leq n_2 \leq N - n_1$

FIG. 9
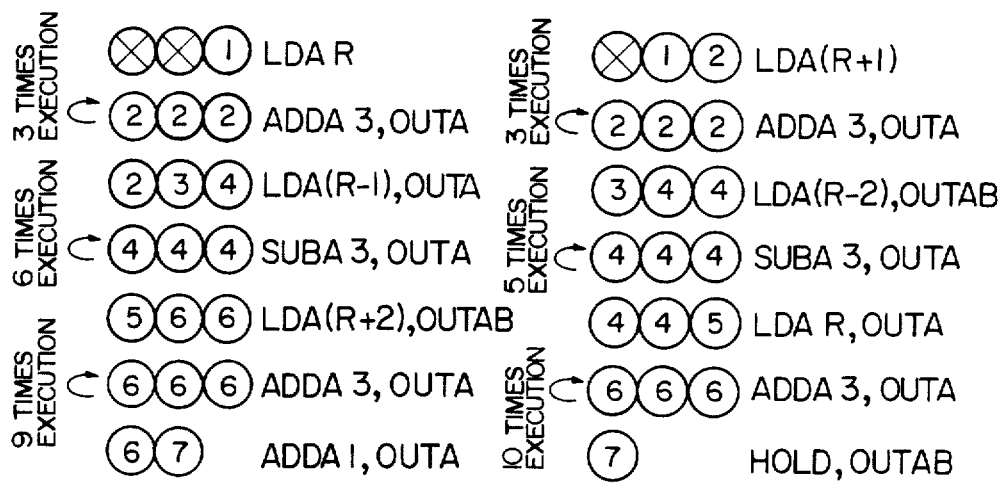
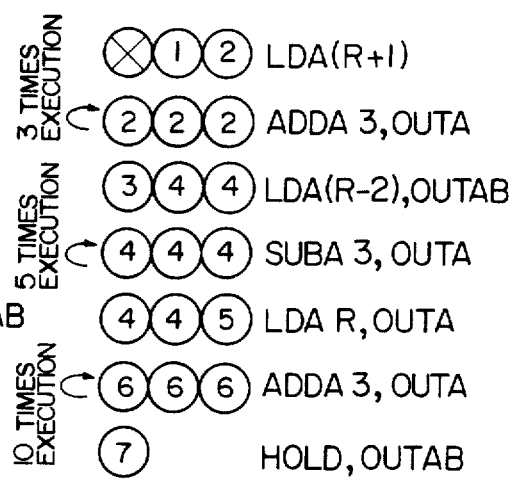
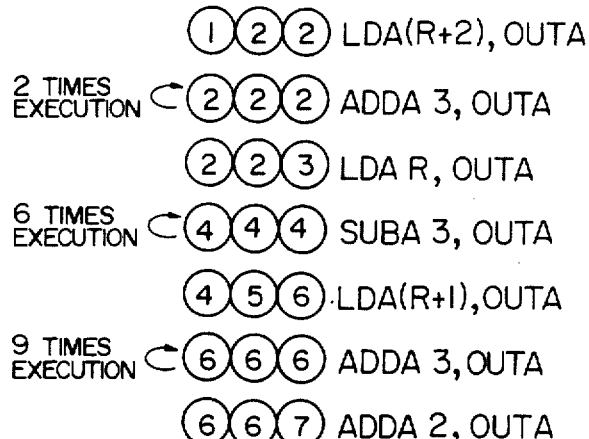

F I G. 12
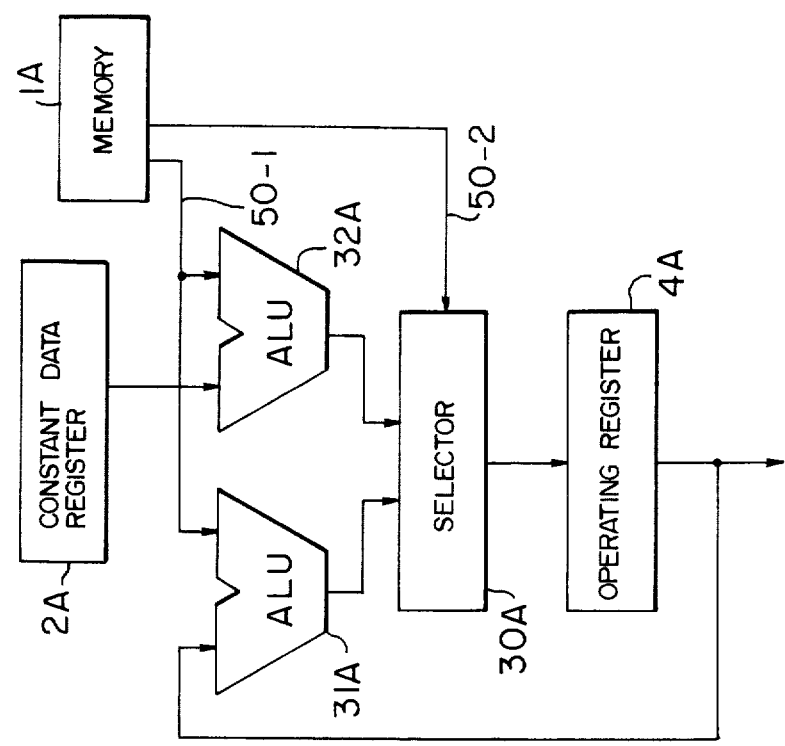
(b)
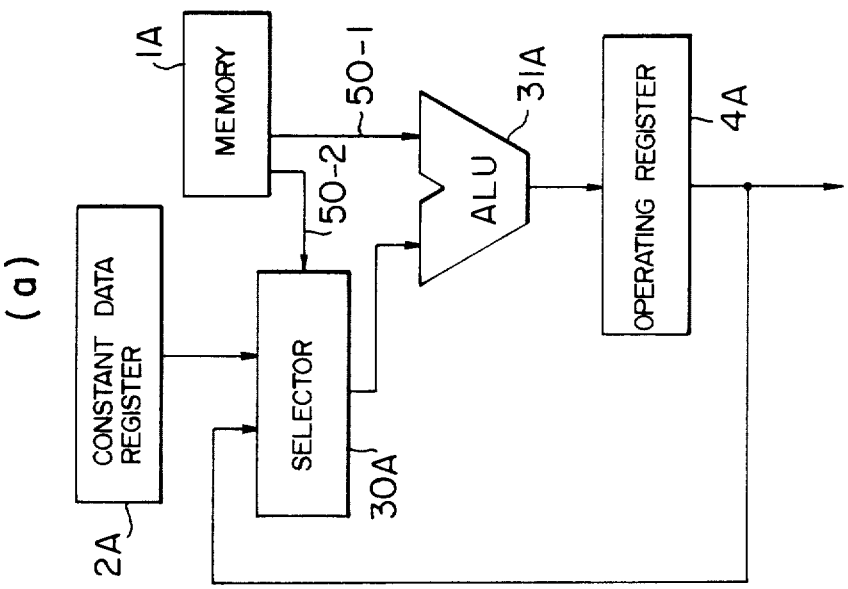
(a)

ASSIGNMENT OF PROGRAM EXECUTION STEPS TO 2 ALPGS (I) AND (II)

PATTERN GENERATOR HAVING PLURAL PATTERN GENERATING UNITS EXECUTING INSTRUCTIONS IN PARALLEL

BACKGROUND OF THE INVENTION

This invention relates to a pattern generator and in particular to a pattern generator which is suitable for generating patterns having an operating function with a high speed.

A prior art pattern generator was an IC test equipment, which is, as described in JP-A-54-12657 as a pattern generator e.g. for an IC test equipment, so constructed that N pattern generators, whose outputs are taken out sequentially, are disposed and they effect pattern generation with a speed N times as high as that of the individual pattern generator as a whole. In this case if the tested IC is a logic IC tested with a test pattern, which has no algorithmic property and is called random pattern, the individual pattern generator is usually constructed with a memory, which stores the test pattern itself, and a relatively simple control logic circuit, which reads out the test pattern, and it seems that it can be easily realized to speed up its operation by parallel read, as described in the publication stated above.

However, in the case where the tested IC is a memory, an algorithmic pattern generator (hereinbelow abbreviated to ALPG) of microprogrammed architecture having an operating function is used as the pattern generator, but parallel operation of N ALPGs cannot be realized by simply connecting N identical ALPGs, because parallel operations, which are totally independent of each other, as performed by an array processor effecting vector operations, are not possible, and also because dummy cycles coming from the particularity that it is a test pattern is not allowed, and such a hardware construction and parallel program techniques, which the prior art computer techniques have not, are inevitable. This fact is not taken into account in the techniques disclosed in the publication stated above.

FIG. 13 shows an approximate construction of a prior art memory IC test equipment. In this equipment a timing generator 3 generates signals such as a rate clock signal determining a test cycle, a phase signal determining a point within the test cycle at which a test signal waveform should be given to a memory T2 to be tested, etc. On the other hand, a pattern generator 2 receives the rate clock signal 4 coming from the timing generator 3, carries out a test program within the pattern generator 2 for every test cycle in synchronism with the rate clock signal 4 and generates various sorts of test patterns. This test program is, in general, sent from the computer 1 to the pattern generator 2 to be carried out therein, after a development or debug of the test program has been carried out in the computer 1 a test system.

Pattern data 5 coming from the pattern generator 2 consist of data applied to the memory under test $T_2$ such as address data, data to be written, read/write control data, etc. and an expected value 6, which is to be compared with read out data.

A fail memory T5 stores judgment result GO/NG obtained on the basis of a judgment stroke signal given by the timing generator 3 to the comparator, which result is transferred to the computer, after having carried out a test, to be subjected there to a defect analysis operation.

FIG. 14 shows the approximate internal construction of the pattern generator 2 in FIG. 13, which consists roughly of a sequence control unit 7 and a data operating unit 8. The sequence control unit 7 has a microprogramed architucture, as indicated in the figure and consists of an instruction memory 9, in which microprograms are stored, a program counter 10 deciding the read address 14 therefor, a multiplexer 11, which changes over the branch address 13 generated during the execution of the program, the program execution starting address specified by the computer 1, etc., and an instruction decoder 101, which decodes the content of the program for generating a load signal 120, which takes-in a new address into the program counter at the moment of branching, etc. and in addition an interruption control signal 111 to the computer 1, etc.

Further, as indicated in FIG. 14, a register 100 storing instruction data 15 coming from the instruction memory 9 generates a branch address signal 13 to the multiplexer 11, a read/write control signal 110 to the memory under test T2 and instruction data 112 to the instruction decoder 101.

The data operating unit 8 carries out arithmetic operations such as addition, subtraction, etc. and logic operations 0/1 inversion, bit shift, etc. according to the instruction data 15 coming from the instruction memory 9 in the sequence control unit 7, and outputs an algorithmic pattern.

In this way the ALPG has a feedback loop made of a hardware for the branch address 13, a load signal to the program counter 10, etc. in order to realize operations including branch operations, such as loops and repeats according to the program, by itself. For this reason, as a method similar to that disclosed in the publication stated previously to increase the speed by disposing a plurality of low speed memories, in which the test pattern is stored, in parallel, a method may be proposed, by which a plurality of ALPGs indicated in FIG. 13 are disposed in parallel. However, as a test equipment for one pattern generator indicated in FIG. 13, it is impossible to use a plurality of test programs (microprograms) 12 connected in parallel as they are. This will be explained below by using a program for memory test pattern generation called galloping indicated in FIGS. 15 and 16.

FIG. 15 illustrates the content of the microprogram for galloping pattern generation together with the flow chart therefor, in the case where the capacity of the memory under test n is 32 bits.

(1) Clear all the cells of the memory under test by means if a loop L1, which is repeated 32 times.

(2) Choose one of the cleared memory cells as the test cell and write data "1" in that memory address (A=address i).

(3) Read out the data at the address (A=address i+j) in the neighborhood of the test cell as a disturb cell and check it.

(4) Read out the test cell address (A=address i) and examine influences of the access to the distrub cell.

(5) Judge whether the access of the remaining 31 bits except for the test cell as the disturb cell is terminated after having read out again the disturb cell address (A=address i+j) and examined it, and if it is not terminated, return to the processing step (3) through a loop L2. Repeat (3)-(4)-(5).

(6) Write data "0" in the test cell address to clear it after having read out all the remaining cells as the disturb cells for one test cell. Then, judge whether the read out and examination described above are completed by using all the cells as test cells. If it is not completed, add 1 ($i=i+1$) to the present test cell address (A=address i) and return to the processing step (2) through a loop L3. The program of the galloping pattern in FIG. 15 is terminated and the flow is ended, after the examination has been completed for the test cells by executing the processings (2)–(6). However, precisely speaking, the galloping pattern is terminated by executing the processings (1)–(6) in the form, where the data "0" and "1" are inverted, called inverse pattern examination, but this is omitted. In this way even a long test pattern called $n^2$ sequence can be expressed by a program statement of only several lines having a loop structure as indicated in FIG. 15, by utilizing the regularity of its generating pattern.

FIG. 16 shows the possibility of the parallel execution, by which two ALPGs (I) and (II) are assigned alternatively to the steps of programs having a same content, for which the flow chart is represented schematically in FIG. 15. As the result, for all the three loops L1, L2 and L3 indicated in FIG. 16, the ALPG, which is in charge of the step at the starting point of the returning loop, and the ALPG, which is in charge of the step at the destination of the returning loop are always same and thus it is impossible to increase the speed by the alternative operation of the two ALPGs as they are, when the program in this figure is carried out.

That is, the loop L1 in FIG. 16 is a repetition of a same step, in which the ALPG (I) operates alone, and the alternative execution of the ALPGs (I) and (II) is impossible. The loop L2 represents a repeated execution including the return from step (5) to step (3) and the steps (3), (4) and (5) are executed alternatively one after another by (I), (II) and (I), respectively, but at the return of the loop L2 from step (5) to step (3), since the same ALPG (1) must execute two successive steps, the parallel execution is impossible. Further, it can be seen that also for the loop L3, at the execution of the return of the loop the ALPG assigned to (6) and (2) is always (II) and therefore two different ALPGs cannot be assigned thereto.

On the other hand, at each step of the program indicated in FIG. 16 the address calculation as indicated in FIG. 15 is performed. Consequently, in order that two ALPGs can perform a program alternatively, as indicated above, it is necessary that one of the ALPGs performs operations after having known the result of operations obtained by the other. In the prior art ALPG system this was not taken into account and also for the address calculation the parallel execution processing was not possible.

As explained above, a test program formed for an IC test equipment constructed by one ALPG cannot be applied to any IC test equipment constructed by N parallel ALPGs for the purpose of increasing the speed. A new measure therefor was absolutely necessitated.

SUMMARY OF THE INVENTION

An object of this invention is to provide a pattern generator capable of resolving the problem of the prior art techniques as described above and generating a pattern with a high speed by the parallel operation of a plurality of ALPGs.

In order to achieve the above object a pattern generator according to this invention comprises the following means.

Loops are previously converted partially in a computer so that a test program (microprogram), which has been formed heretofore for an IC test equipment with one ALPG, can be executed sequentially and alternatively by N ALPGs, and in particular that the contradiction in the successiveness produced in the loops as stated, referring to FIG. 16, is eliminated. The processing steps, of which each of the N ALPGs is in charge for the program thus converted, are taken out and a program for N ALPGs is formed, based on the program for one ALPG, so that the processings, which have been made discrete as the result of the take out, can be executed correctly. The problem described above can be resolved by transforming the program in this way into the processings and by transmitting them before the execution of the test from the computer to the instruction memory 9 of each of the ALPGs. FIGS. 4 and 5 illustrate examples of the program, for which the loops in the program indicated in FIG. 16 are converted for the parallel execution with two ALPGs so that they can be executed by the ALPGs (I) and (II). A first feature of this invention lies in that each of the ALPG programs is formed by converting previously the loops by means of calculating means, which constitute a part of the component elements of this invention, as indicated in FIGS. 4 and 5, so that the number of steps within a loop is an integer times as great as the number of the ALPGs parallelly disposed, in order to make the parallel execution for increasing the speed possible.

A method for converting a program and an assignment method to two ALPGs will be explained below more in detail, taking the parallel execution with two ALPGs as indicated in FIGS. 4 and 5 as an example. FIG. 4($a$) is identical to FIG. 16. FIG. 4($b$) indicates the intermediate state, to which the innermost loops $L_1$ and $L_2$ in ($a$) are converted. At first, since the number of steps within the loop L1 is 1, the loop is converted so as to be doubled, i.e. so that the number of steps is 2, and the number of repetitions of the loop is reduced from 32 to 16. In this way the processing step (1) can be executed alternatively, by using the two ALPGs (I) and (II). On the other hand, since the number of steps within the loop L2 is 3, when it is converted so as to be doubled, the number of steps becomes 6, which is an integer times as great as the number of ALPGs, i.e. $2\times3$, which makes the alternative and parallel execution possible. However, in this example of L2, since the number of repetitions of the loop is 31, which is an odd number, the number of repetitions of the loop after the conversion of doubling is 15 and the remaining one loop is disposed before $L_2'$ as it is. Of course, in this case, another conversion method, by which all the steps are included within $L_2'$ and the processing goes out of the loop in the middle course.

Then the other outer loop $L_3'$ is converted in the same way. At this time the number of steps in the loop $L_3'$ includes the loop $L_2'$ converted therein, the number of steps within which should be taken into account. That is, the number of steps within $L_3'$ is $$4+(6\times15)+1=95.$$

Consequently the relation that the number of steps is an integer times as great as the number of ALPGs, which is 2, cannot be obtained, and the successive execution is impossible at the return of the loop L3'. FIG. 4(c) indicates the result obtained by converting the loop L3' into 190 steps, which is twice as great as 95, so that the number of steps in the loop L3' is an integer times as great as the number of ALPGs, i.e. 2. The number of repetitions of the loop L3" obtained as this conversion is 16, which is a half of 32, because the loop is converted to the doubled number of steps.

The program after the conversion indicated in FIG. 4(c) as described above can be executed alternatively and sequentially by two ALPGs without contradiction in spite of the existence of the loops.

In FIG. 4(c), for the second half of the conversion within the loop L3" the remaining processing added before the loop L2' due to the fact that the number of repetitions is an odd number, described by referring to FIG. 4(b), is added here after the loop L2'.

This is done while taking into account the easiness of the assignment of the program to the ALPGs (I) and (II) and this is not essential feature of this invention.

FIGS. 5(a) and (b) indicate new programs formed by taking out the steps for the ALPGs (I) and (II), respectively, from FIG. 4(c).

On the other hand, the fact that the program is thus converted and assigned to the ALPGs is for each of the ALPGs to carry out only the processings assigned thereto with an interval, which is equal to the number of the ALPGs and therefore it is necessary to give it the content of the processings executed by the other ALPGs as an accumulated instruction.

This will be explained below more in detail.

FIG. 6(a) indicates the operation of one prior art ALPG, in which S represents the state of the internal register for operation, etc. in the ALPGs and O indicates the output of the ALPGs. g is an output instruction, which is an instruction to obtain O based on S without changing the internal state S for operation of the ALPGs. f is an internal state renewal instruction. Now, it is assumed that $S_T$ be the internal state at a point of time (cycle) T. An output $O_T$ is obtained, based on an output instruction $g_T$ at the same point of time (cycle). $S_T$ is renewed by an internal state renewal instruction $f_T$ and another internal state $S_{T+1}$ for operation at the succeeding point of time (cycle) T+1. That is, it is possible to represent the aspect, by which the ALPGs renew sequentially their internal state and output values corresponding thereto, by the following two equations:

$$O_T = g_T(S_T) \quad (1)$$

$$S_{T+1} = f_T(S_T) \quad (2)$$

FIG. 6(b) represents the aspect, in the case where the same output series as FIG. 6(a) is obtained by outputting sequentially by means of three ALPGs instead of two ALPGs stated above. Each of the ALPGs realizes sequentially the discrete internal states and the outputs, which are originally for one ALPG, while executing the operations with a shift of one cycle between two successive ALPGs. Here the operation of ALPG (I) can be represented by the following two equations;

$$O_T = G_T(S_T) \quad (3)$$

$$S_{T+3} = F_T(S_T) \quad (4)$$

From Eqs. (1) and (3)

$$O_T = g_T(S_T) = G_T(S_T)$$

thus $g_T = G_T$ \quad (5)

and from Eqs. (2) and (4)

$$S_{T+3} = f_{T+2}(S_{T+2}) = f_{T+2}.f_{T+1}(S_{T+1}) = f_{T+2}.f_{T+1}.f_T(S_T) = F_T(S_T)$$

thus $F_T = f_{T+2}.f_{T+1}.f_T$ \quad (6)

are obtained, where $f_{T+2}.f_{T+1}.f_T$ means an accumulation of instruction effects, e.g. if $f_T$ instructs +1 to the separation register, $f_{T+1}$ instructs +3 and $f_{T+2}$ instructs −2, $F_T$ means +2, which is an accumulation of effects of +1+3−2.

In general, for N ALPGs $$O_T = G_T(S_T) \quad (7)$$

$$S_{T+N} = F_T(S_T) \quad (8)$$

$$G_T = g_T \quad (9)$$

$$F_T = f_{T+N-1}.f_{T+N-2}\cdots f_{T+2}.f_{T+1}.f_T \quad (10)$$

These four equations (7), (8), (9) and (10) represent the principle for forming a parallel program.

In the above, the method for forming the parallel program has been disclosed. Here the output instruction $G_T$ is the same as the conventional output instruction $g_T$, as is clear from Eq. (9) and no special hardware, which is not used heretofore, is required in order to realize it. However the internal state renewal instruction $F_T$ is an accumulation of N conventional internal state renewal instructions f, as indicated by Eq. (10), which cannot be realized by using the prior art construction of the operating device for ALPG.

FIG. 17 illustrates the construction of an operating device in a prior art ALPG. Such a construction is disclosed in JP-A-54-36055 and JP-A-57-52679. A prior art operating device as indicated in FIG. 17 was constructed so as to effect loading of the value in a constant data register 2A to an operating register, addition and subtraction.

In contrast, the accumulated operating instruction requires functions, which the prior art operating device has not. FIG. 7 indicates a prior art operation instructing system and an accumulated operation instructing system. FIG. 7(a) shows one of the simplest set of prior art operating instructions and (b) illustrates a set of accumulated instructions. Similarly (c) shows a prior art enlarged instruction set and (d) illustrates a set of accumulated instructions therefor. Here n, $n_1$ and $n_2$ have different values, depending on the kind of accumulated instructions and the order of the arranged instructions. Therefore it is difficult to use them, set previously in the constant data register. Consequently, according to this invention the accumulated operation instruction is achieved by disposing an operating device, in which information n, $n_1$ and $n_2$ is stored previously in a memory 1, this information is read out at the operation, and arithmetic operations are effected with values in the constant data register 2A and the operating register 4A, as the construction of the operating device indicated in FIG. 11.

Hereinbelow, taking a concrete program as an example, the method for forming a parallel programing and the aspect of the execution in the operating device will be described and their operations will be explained.

FIG. 8(a) shows an ALPG program for one prior art ALPG. This is a program consisting of seven lines and constructed by execution order control instructions controlling the order of programs, operating instructions controlling loading and arithmetic operations, and output instructions, which make the operating register output its content as it is or inverted. Here, for the sake of simplicity, the execution order control instructions are not indicated as they are and only their order is indicated. Further, the operating instruction system is one indicated in FIG. 7(a). LDA R instructs to load the value of the constant data register R to the operating register A; INCR A instructs to add 1 to the operating register A; DECR A instructs to subtact 1 from the operating register A; and HOLD instructs not to change the value of the operating register A.

OUTA is an output instruction, instructing to output the value of the operating register A as it is and OUTAB instructs to output inverted one of the values of the operating register A.

Supposing that the value of the constant data register R is 100 and that the initial value of the operating register A is 0, FIG. 10(a) represents the output series obtained by executing the program indicated in FIG. 8(a).

Now, taking a case where a same output series as that indicated above is obtained by using three ALPGs as an example, the formation of a parallel program will be described below.

As stated previously, the parallel program is obtained by putting together N (3 in this example) in the original program according to the order of the execution. FIG. 8(b) illustrates a program corresponding to the program of FIG. 8(a) with portions thereof indicating a repetition of the same instruction step in order to clarify the order of the execution of the program indicated in FIG. 8(a).

FIGS. 9(a), (b) and (c) each show a program comprised of series of instructions with respect to each of three ALPGs. Each series of instructions is formed by putting together or accumulating instructions, three by three, takes from the series of instructions arranged in the order of execution, as shown in FIG. 8(b), with the position in the uppermost row (i.e., rows of Ⓧ Ⓧ ①, Ⓧ ① ② and ① ② ② shown in FIGS. 9(a), (b) and (c)) of the first or uppermost instruction (1) of FIG. 8(b) shifted as shown in FIGS. 9(a), (b) and (c). For example, in FIG. 9(a), instructions are put together or accumulated, three by three, starting from the position succeeding the first instruction (1) shown in FIG. 8(b). Here, for accumulated rows of instructions which rows are comprised of the same instructions, only one row of instruction is illustrated with a statement attached showing repetition. The third row shown in FIG. 9(a) is a new instruction formed by putting together or accumulating the three instructions (2), (3) and (4) of the original program into the new instruction, wherein as an output instruction of the new instruction, the output instruction of the top instruction (2) is used as it is, while as an operation instruction of the new instruction, Load A (R−1) is formed by putting together or accumulating +1, Load A R and −1 into the operation instruction.

FIGS. 9(b) and (c) represent results obtained by converting the original program in the same way. Here, contrarily to the fact that all the numbers of loads to the operating register A were values in the constant data register R in the original program, after the conversion they are R−2, R−1, R, R+1, R+2. Further, contrarily to the fact that the operating instructions were ±1 in the original program, the number of operations such as ADDA (addition) 3, SUBA (subtraction) 3, . . . etc. is increased. The number of operations such as ±1, ±2, ±3, etc. can be calculated by storing them previously in the memory 1A of the operating device. In fact, adopting the construction of the operating device according to this invention, all the operations appearing in FIGS. 9(a), (b) and (c) can be clearly realized.

FIGS. 10(b), (c) and (d) illustrate results of the execution of FIGS. 9(a), (b) and (c), respectively. It can be understood that an output corresponding to FIG. 10(a), which is the initial output series, can be obtained sequentially from the three ALPGs.

BRIEF DESCRIPTION OF THE DRAWINGS

FIG. 7 is a scheme for explaining a prior art operation instruction system and an accumulated operation instruction system.

FIGS. 8 and 9 are schemes illustrating a concrete example of the parallel program formation.

FIG. 12 is a scheme illustrating another embodiment of the construction of an operating device according to this invention.

DESCRIPTION OF THE PREFERRED EMBODIMENTS

An embodiment of the pattern generator according to this invention will be explained below in detail, referring to FIG. 1.

Figure 1:
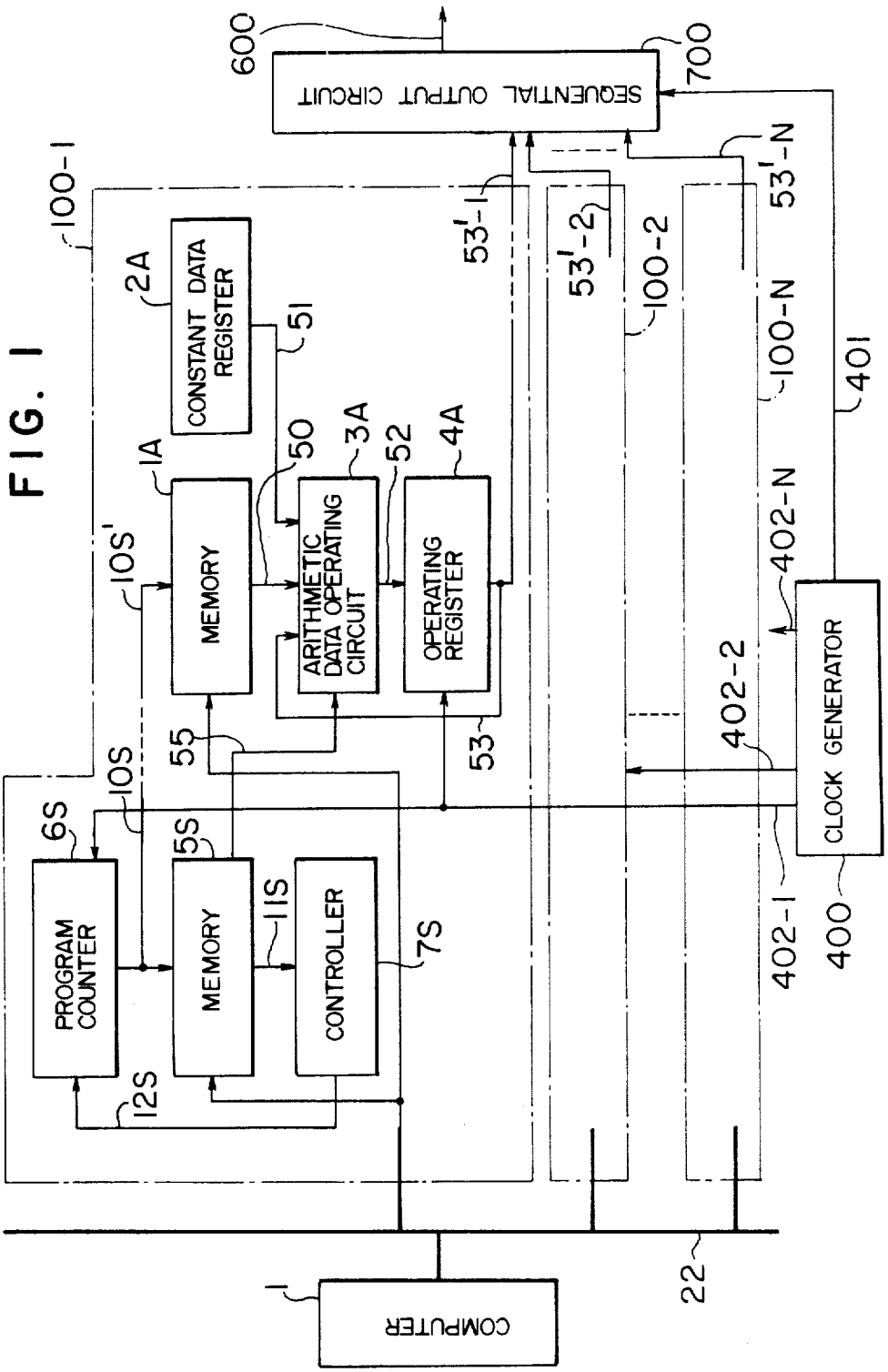
FIG. 1 is a scheme illustrating an embodiment of the pattern generator according to this invention.
Figure 2:
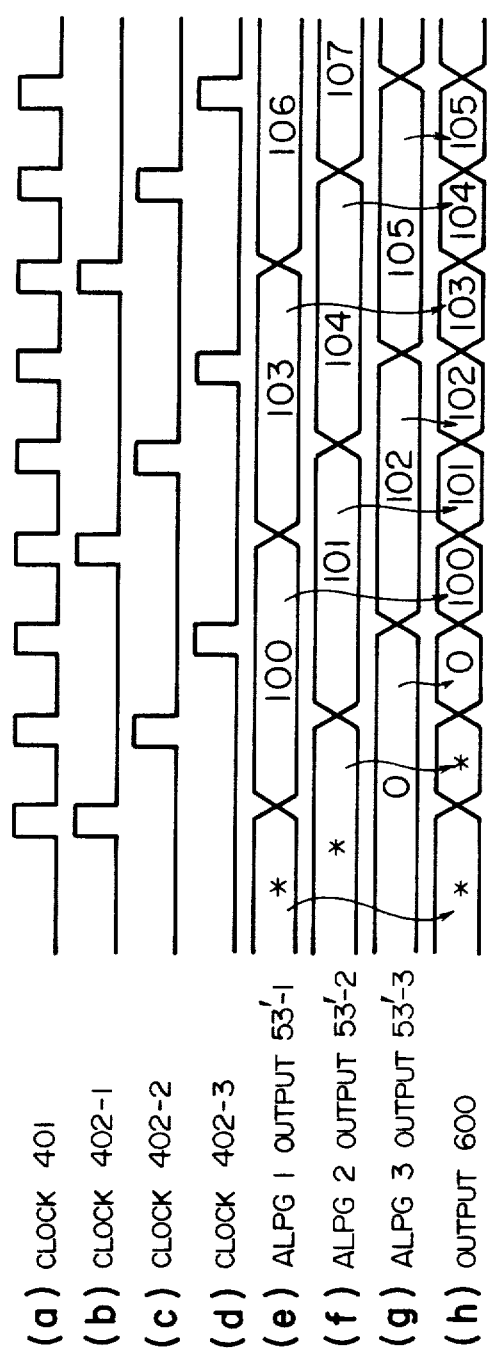
FIG. 2 is a scheme showing the timing of the operation of principal signals in FIG. 1.

In FIG. 1 the number of ALPGs is 3 and a sequential pattern is outputted by a parallel operation of the three ALPGs (N=3).

At first, it is provided with a memory 5S, in which an instruction controlling the order of execution of a program for one ALPG (repetition control, etc.) and an operation selective instruction 55; a program counter 6S outputting reading out addresses 10S for this memory 5S; a controller 7S, which interpretes the control instruction 11S read out from the memory 5S, outputs a corresponding control signal 12S to the program counter 6S and specifies the address to be subsequently generated; a memory 1A accessed by the address 10S' corresponding to the address 10S generated by the program counter 6S and reading out information 50 necessary for the operation in an arithmetic data operating circuit 3A; a constant data register 2A previously storing and holding constant data 51 necessary for the operation; the arithmetic data operating circuit 3A effecting arithmetic operations, using operation information outputted by the memory 1A; an operating register 4A taking-in every time the operation result 52 and holding it; and an output circuit (not shown in the figure) outputting the output 53 of the operating register 4A as it is or the output (53'-1) after having performed an arithmetic logic processing thereon. In FIG. 1 a buffer circuit may be disposed between the address 10S and the address 10S' and the address 10S may be inputted in the memory 1A as it is.

Further, although the memory 1A and the memory 5S are described in FIG. 1, as if they were separated memory means, they can be a same memory, if the program execution order control instruction and the operating instruction are previously stored so that a plurality of ALPGs can be operated in parallel as stated previously.

The whole structure of ALPG is provided with three ALPGs (100-1, 100-2, 100-3) described above and comprises a sequential output circuit 700 outputting an output 600 their outputs (53'-1, 53'-2, 53'-3) changed over sequentially; a clock generator 400 outputting operating clocks to each of the ALPGs and the sequential output circuit 700; a computer 1, which analyzes programs made by a user, effecting the parallelizing processing for the instructions N by N (3 in this embodiment) according to the execution order and forms a program for every ALPG (100-1, 100-2, 100-3); and a data transferring path 22 transferring generated instructions and operation numbers.

In FIG. 1 the internal construction of the pattern generators represented by 100-2 to 100-N is omitted, because it is identical to that of 100-1.

A concrete structure of the operating device unit in FIG. 1 is indicated in FIG. 12. In FIG. 12 ALU can perform an operation of ±n (0≦n≦N) for an input. In FIG. 12(b) the position of the selector and that of the ALU in (a) are interchanged and they have the same effect. Further, when the operating instruction system is represented by FIG. 7(d), the device may be so constructed that a multiplier is disposed at the output of the constant data register. In addition, although this embodiment has been explained, supposing that one constant data register belongs to one operating register, a plurality of constant data registers may be disposed for every operating register. In the case where operations are effected by a plurality of constant data registers for one operating register, the structure of the operating device is complicated, but the device may be so constructed that a multiplier is disposed at the output of every constant data register and that the result obtained by adding and subtracting their outputs among them is inputted in the operating register after having been further added and subtracted with the operating register.

Although the speed of operations are increased by using three ALPGs in this embodiment, the number of ALPGs is not restricted to 3, but any number thereof may be used. In addition, although explanation has been made, referring to FIG. 1, supposing that the computer, which arranges the programs in parallel, and that the ALPGs are connected by means of a hardware, the connecting method is not restricted thereto, but it may be effected through the intermediary of magnetic tapes, floppy discs, etc. In this case a data transferring path is disposed between the recording medium reading out device and the ALPGs.

Although explanation has been made in this embodiment, supposing that the output address 10S of the program counter 6S and the address 10S' accessing the memory 1A are identical, a table memory or a logic circuit may be disposed therebetween so that the memory 1A is accessed with a transformed address. What is essential is that the address 10S' and the address 10S correspond unequivocally to each other.

Although it is supposed in the above explanation that the memory 5S and the memory 1A are rewritable, this is not essential, but, if sorts of test patterns to be generated are limited, ROMs, in which programs having parallel processings are stored previously, may be used for the memory 5S and the memory 1A.

Further, although explanation has been made in the embodiment, supposing that numerical values, which are about $0 \leq n \leq N$, are read out from the memory 1A and that values obtained by adding and subtracting them are inputted in the constant data register or the operating registers, the device may be so constructed that the device may be provided with a memory having a bit width greater than that of the operating registers, in which memory 1A values obtained by adding or subtracting n to or from the constant R are previously stored and that no constant data register is used.

Furthermore the device may be provided with a plurality of constant data registers, in which values of $R \pm n$ are previously set.

In addition the sequential output circuit 700 may be constructed by a multiplexer, as disclosed in JP-A-54-12657 or by a shift register as disclosed in JP-A-56-101224.

Figure 3:
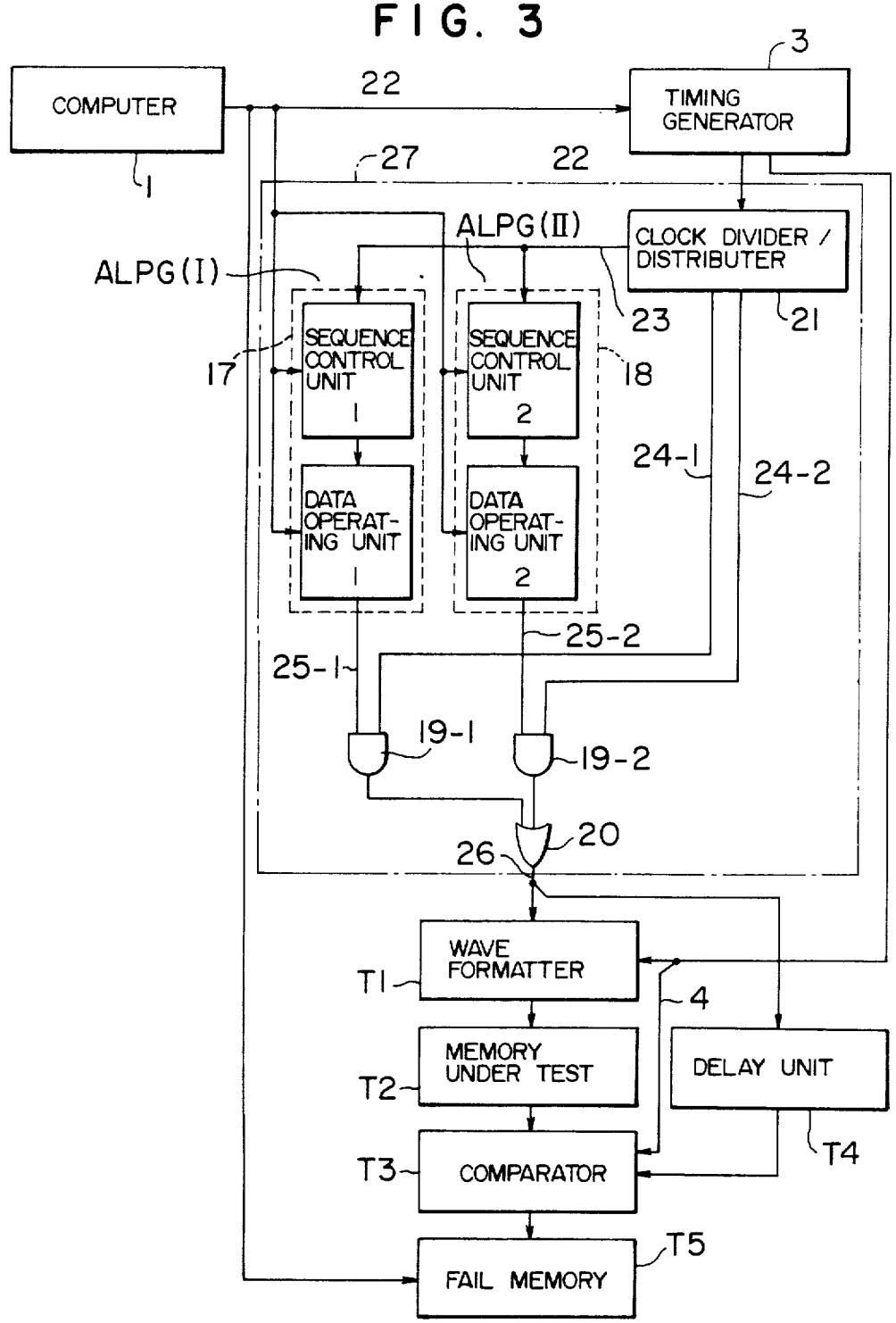
FIG. 3 is a block diagram indicating the construction of an IC test equipment using a pattern generator according to this invention.
Figure 4:
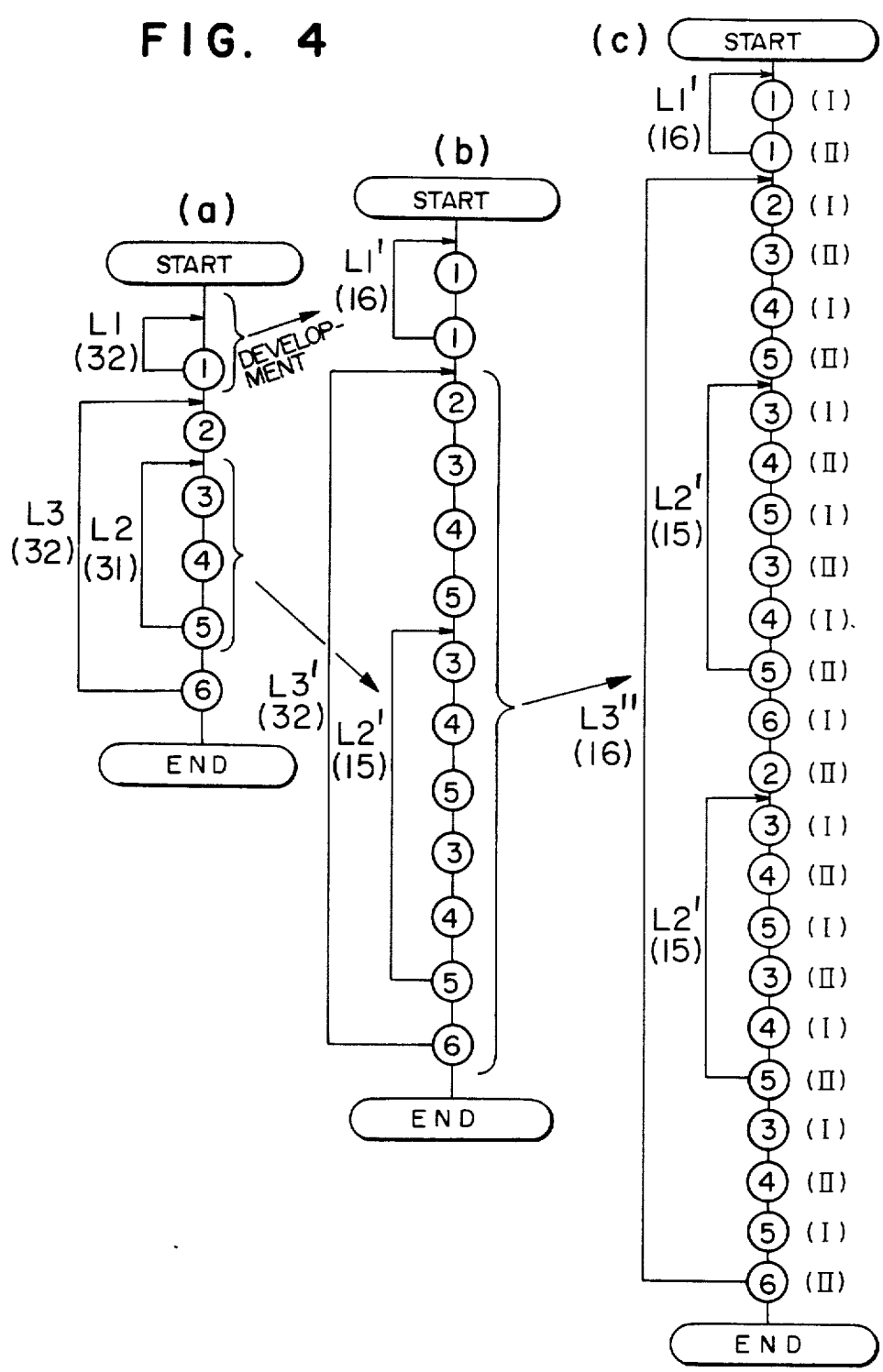
FIGS. 4 and 5 are schemes for explaining the program conversion method and the method for the assignment to the ALPGs, in the case where two ALPGs are operated in parallel.
Figure 5:
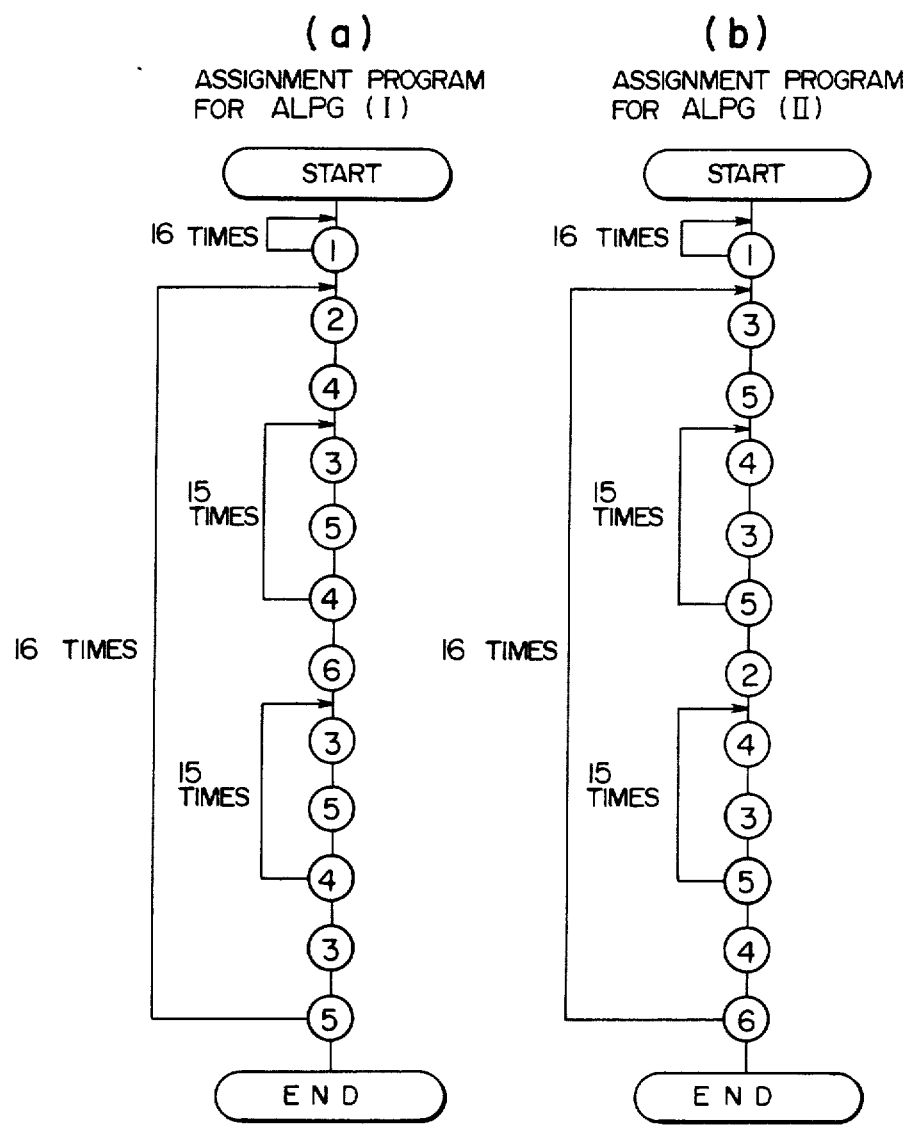
Figure 6:
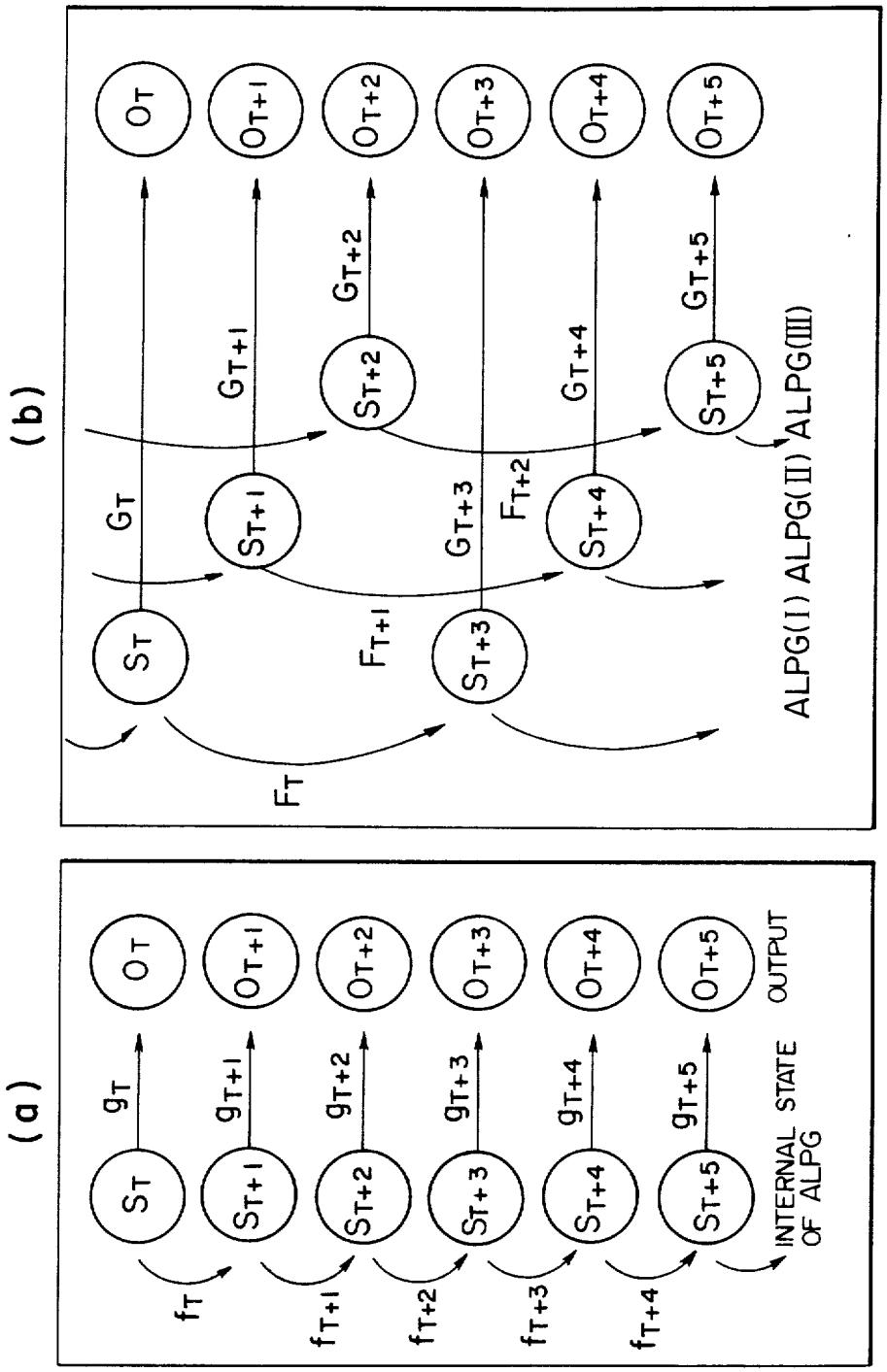
FIG. 6 is a scheme for explaining a parallel program formation method, in the case where three ALPGs are operated in parallel.
Figure 8:
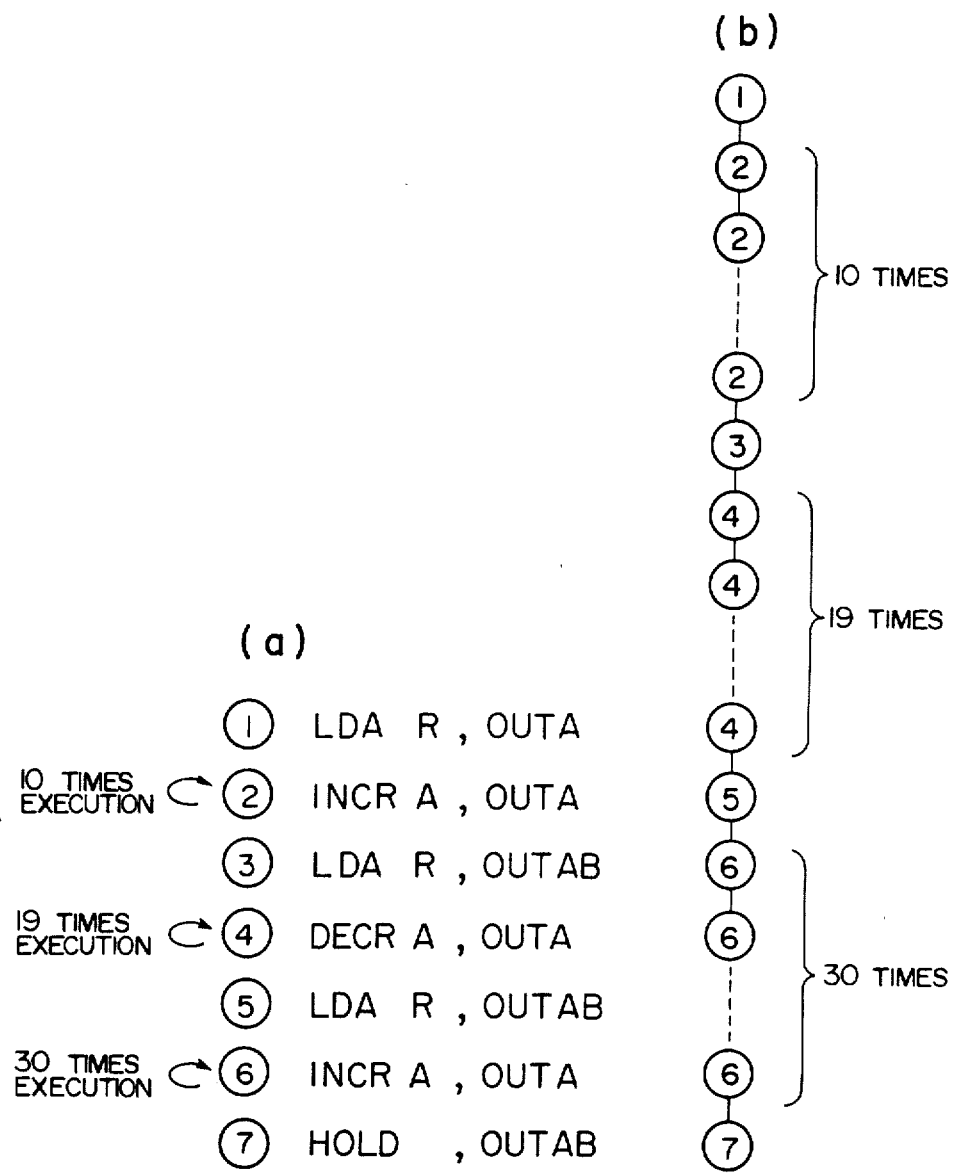
Figure 10:
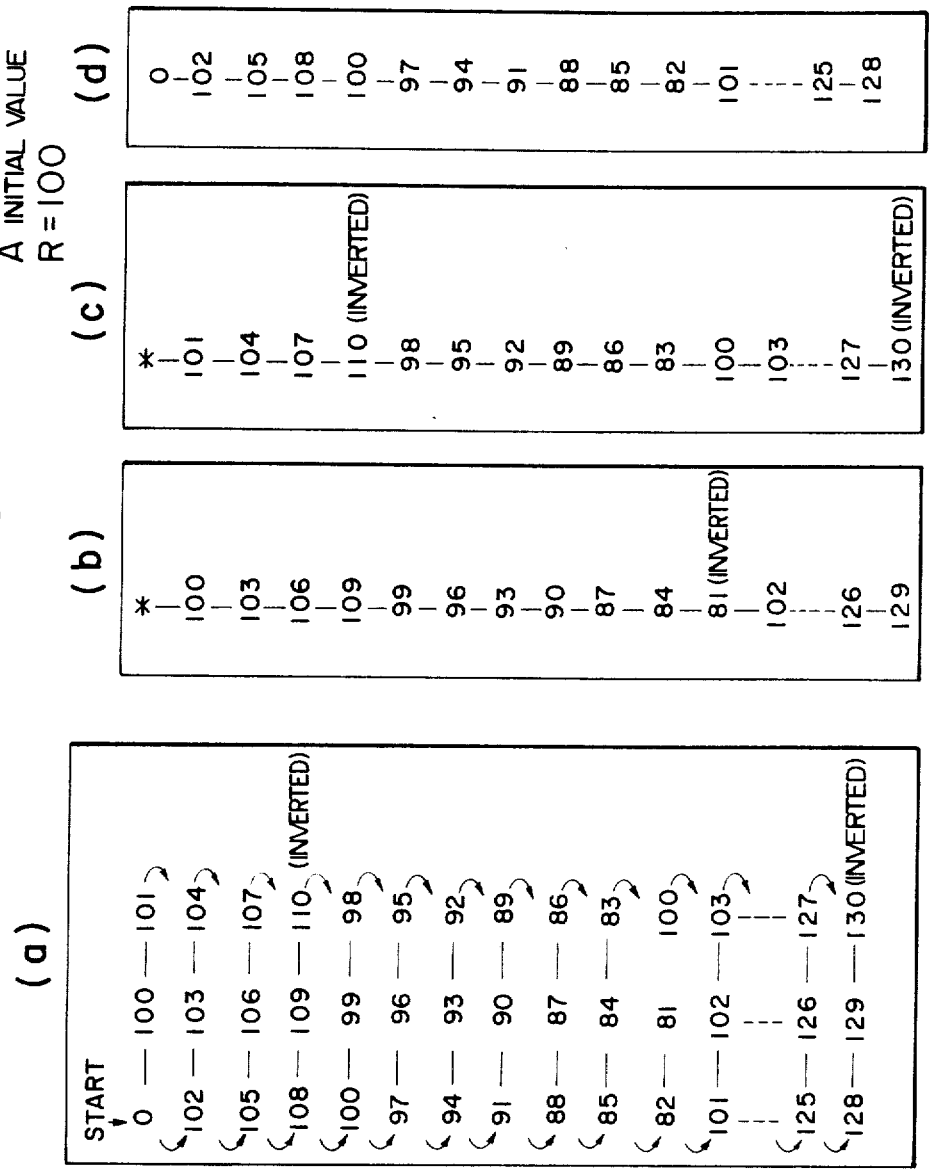
FIG. 10 is a scheme for explaining a result of the execution of the parallel program, concerning the concrete example indicated in FIGS. 8 and 9.
Figure 11:
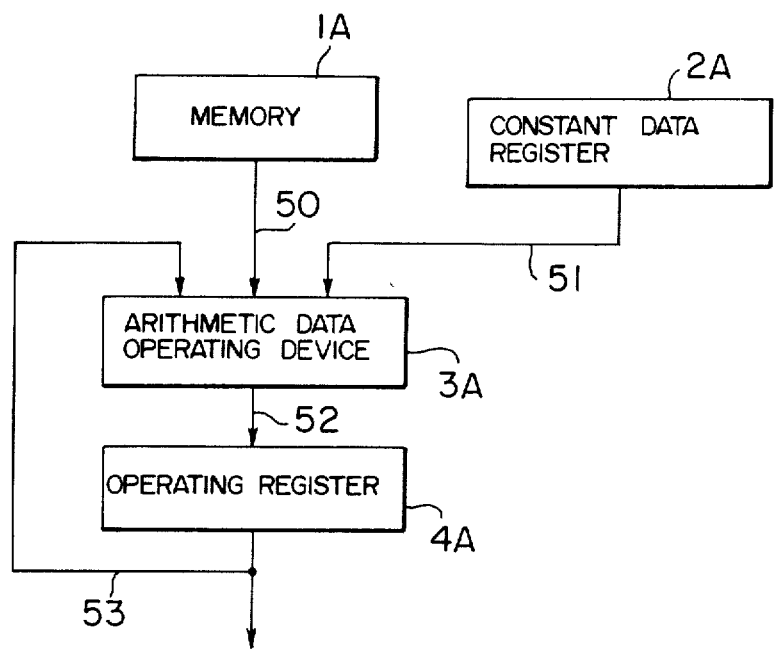
FIG. 11 is a scheme illustrating an embodiment of the construction of an operating device in an IC test equipment according to this invention.

Next a construction, by which a pattern generator according to this invention is applied to an IC test equipment, is indicated in FIG. 3.

Figure 13:
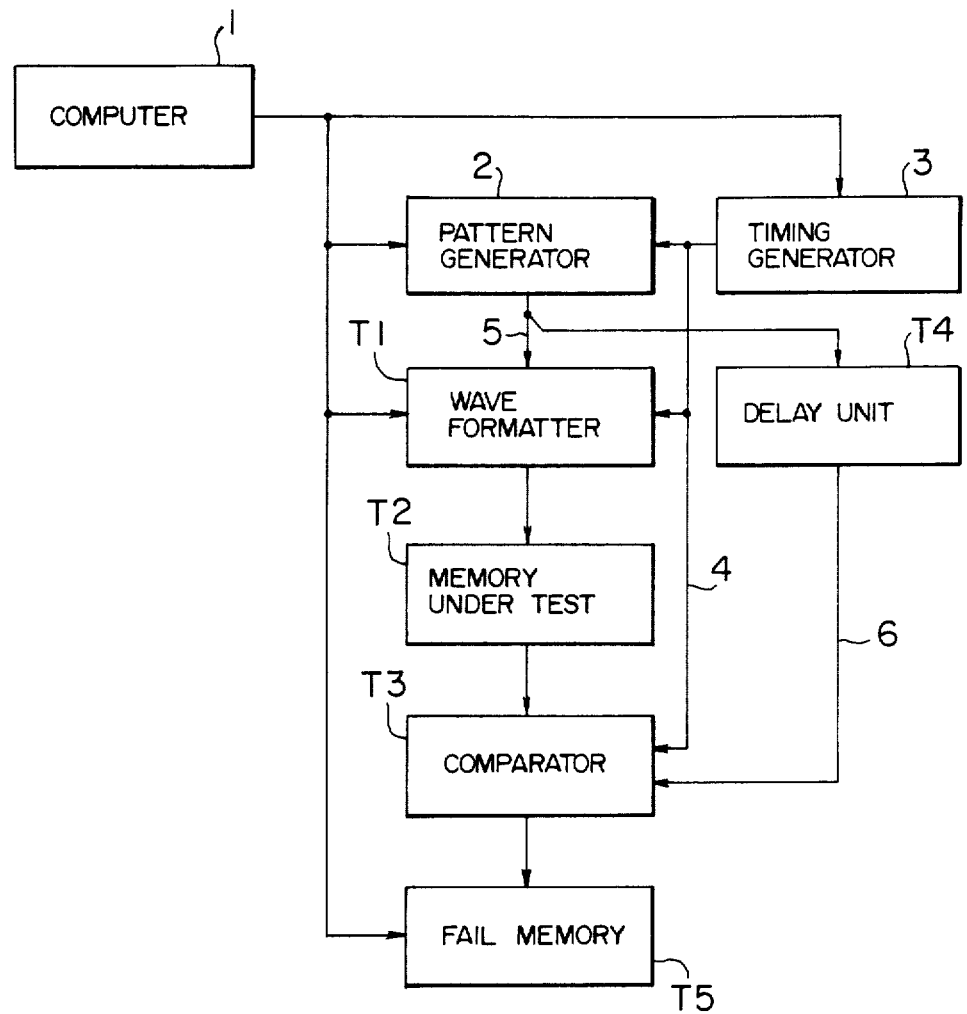
FIG. 13 is an approximate scheme illustrating the construction of a prior art memory IC test equipment.
Figure 14:
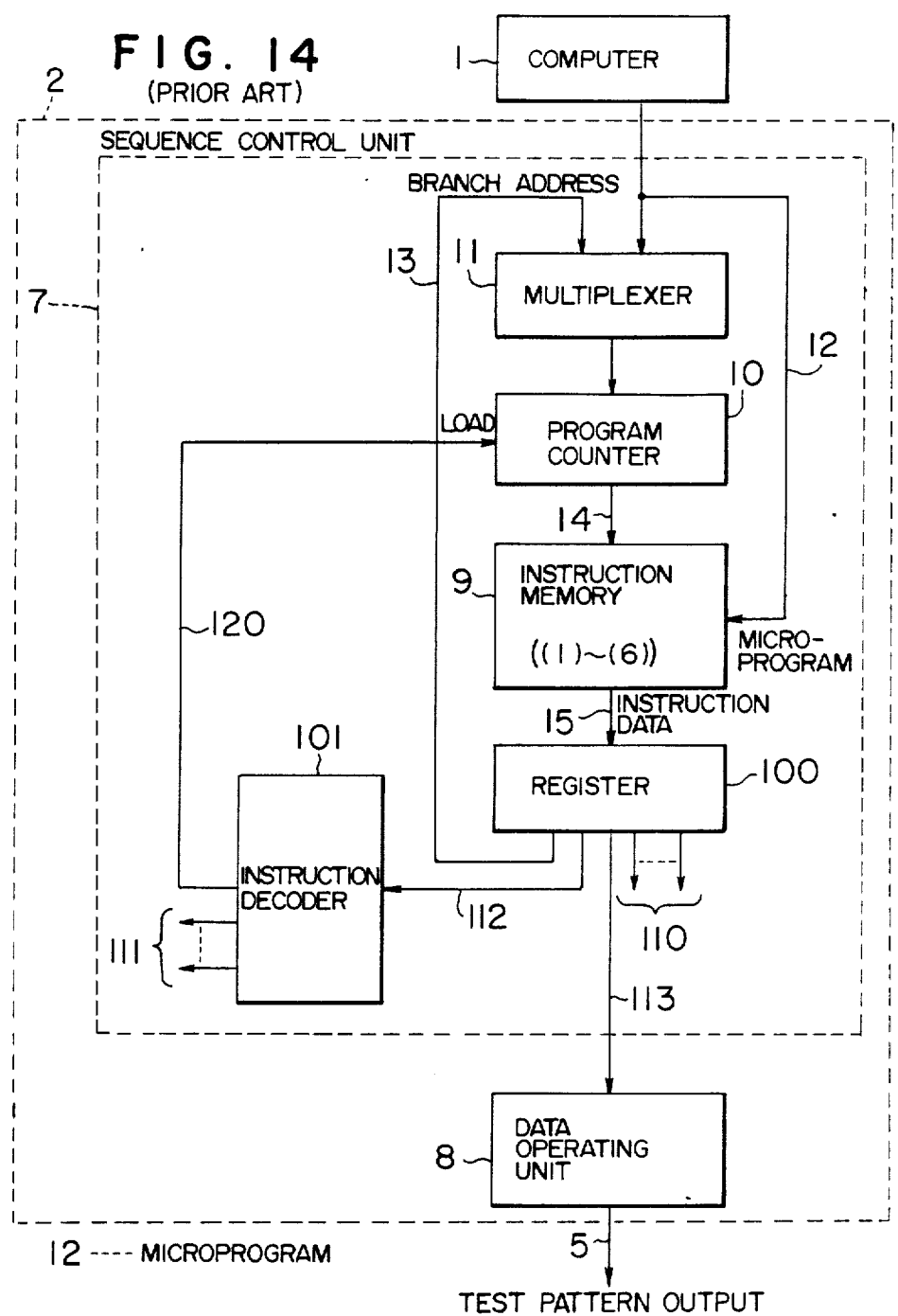
FIG. 14 shows the internal construction of the pattern generator indicated in FIG. 13.
Figure 15:
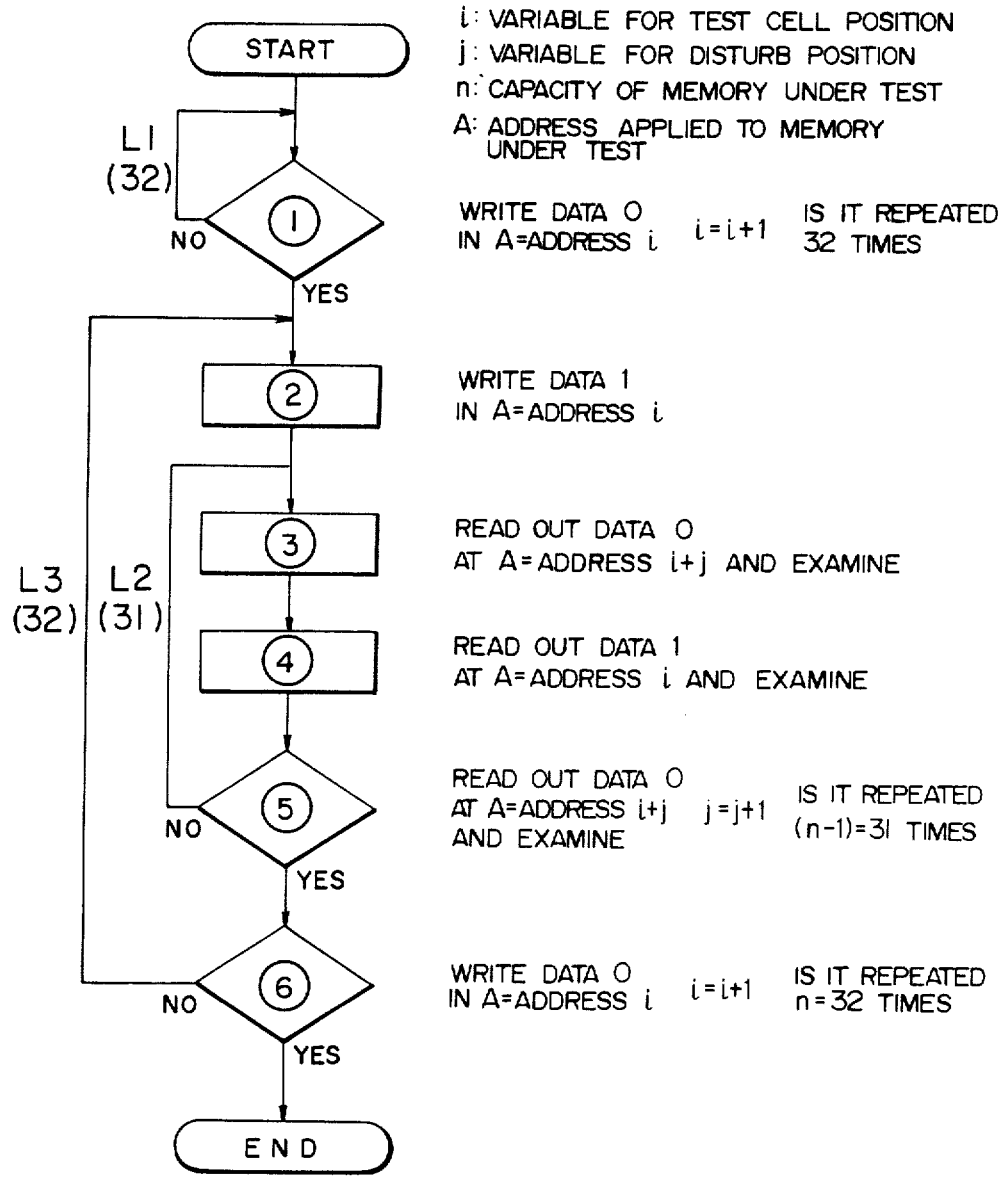
FIG. 15 shows an example of the microprogram for the galloping pattern generation well known as a memory test pattern.
Figure 16:
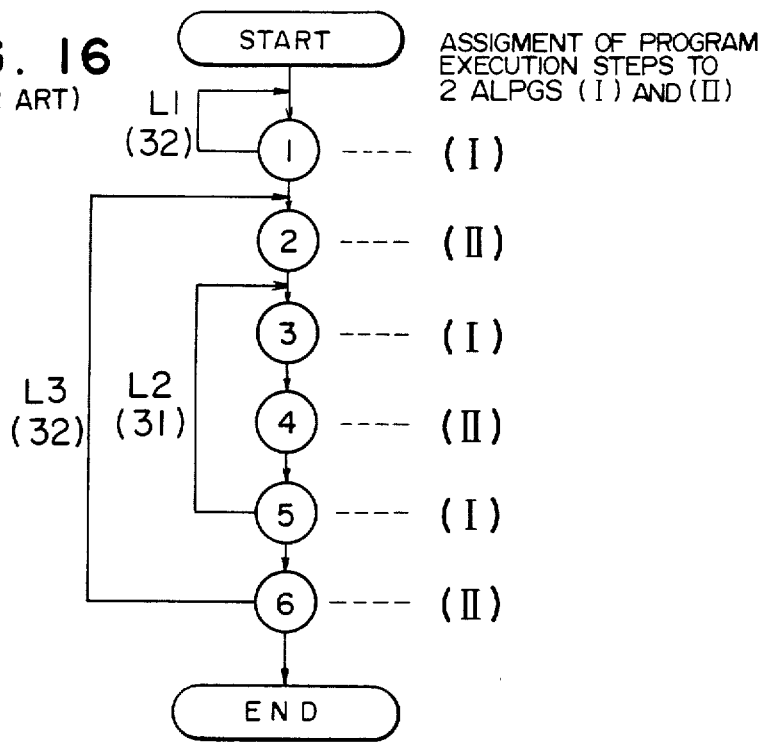
FIG. 16 is a scheme of the flow chart indicated in FIG. 15.
Figure 17:
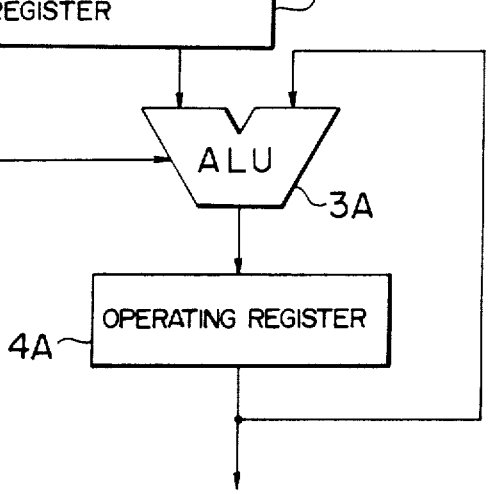
FIG. 17 is a scheme illustrating the construction of a prior art operating device.

This figure shows a high speed IC test equipment, in which the pattern generator unit 2 in the prior art device indicated in FIG. 13 is replaced by a high speed pattern generator unit according to the parallel execution method, which consists of ALPG(I) 17, ALPG(II) 18, a clock divider/distributer 21, AND gates 19-1, 19-2 and an OR gate 20 sequentially and selectively changing over the output of the two ALPGs.

The timing generator 3, which is used also in the prior art system, outputs the operating basic clock 22 for operating the pattern generator unit and the timing signal 4 to the wave formatter T1 and the comparator T3.

The computer 1 analyzes previously the program structure before the execution of test of a test pattern program for pattern generation formed for the prior art structure indicated in FIG. 13, transforms it into a test program for ALPG(I) and ALPG(II), and transfers it to each of the ALPGs through a data bus 22. The computer 1 sends various sorts of data to the other parts in FIG. 3 in order to effect set-up operations necessary for the execution of the test and analyzing operations of data stored in a fail memory. These are not especially remarkably different from those for the prior art IC test equipment.

As explained in the above embodiment, each of the ALPGs can operate with a low speed, whose test cycle is N times as long as the minimum test cycle necessary for the IC test equipment, owing to the fact that the computer 1 forms a program for generating test patterns, by means of which N ALPGs can operate in parallel, and that it is stored in an ALPG instruction memory (corresponding to the memory 5S in FIG. 1) through a data bus disposed in the IC test equipment before the execution of the test. Consequently it is possible to use ICs or LSIs, whose operating speed is lower than that or recent memories, whose speed has been significantly increased, in order to construct test equipments therefor, and an effect can be obtained to realize easily the test equipments therefor.

According to this invention, it is possible to generate and execute operating instructions to output discrete values of the test pattern specified by a user program. Consequently, since desired test patterns are sequentially outputted by using a plurality of ALPGs, it is possible to generate a test pattern with a speed, which is several times as high as the highest operating speed of the individual ALPGs.

We claim:

1. A pattern generator for executing a series of input or original operation processing instructions input thereto to generate a test pattern, comprising:
    first to N-th pattern generator units each including arithmetic logical operation means for executing a series of operation processing instructions;
    sequential output circuit means, coupled to outputs of said first to N-th pattern generator units and responsive to clock pulses, for sequentially selecting one of the outputs of said first to N-th pattern generator units in synchronism with said clock pulses, said sequentially selected outputs providing said test pattern; and
    memory means disposed in each of said first to N-th pattern generator units and connected to respective arithmetic logical operation means, for storing information including a series of new operation processing instructions, each of said new operation processing instructions being obtained by putting together operation processing instructions, N by N, taken from said series of input or original operation processing instructions and stored in an order according to which said series of input or original operation processing instructions are to be executed if said series of input or original operation processing instructions were serially executed.

2. A pattern generator according to claim 1, wherein when said series of input or original operation processing instructions includes a loop and/or repetition instructions, said loop and/or repetition instructions are rearranged, prior to execution thereof by the pattern generator units, so that the number of instruction steps within each of said loop and/or repetition instructions is an integer divisible by N.

3. A pattern generator according to claim 1, further comprising means disposed in each pattern generator unit, for controlling said arithmetic logical operation unit, said control means including second memory means for storing an instruction controlling an order of executing said new operation processing instructions; a program counter for generating read addresses of said second memory means; and a control unit for interpreting the order control instruction read out of said second memory means.

4. A pattern generator according to claim 1, wherein said arithmetic logic operation means comprises an arithmetic operating circuit, operating registers, in which outputs from said arithmetic operating circuit are stored, and a constant data register supplying constants necessary for operations to said arithmetic operation circuit.

5. A pattern generator according to claim 4, further comprising an auxiliary register coupled to said constant data register, wherein values obtained by adding and subtracting n (n is an integer satisfying $0 \leq n \leq N$) to and from the value held by said constant data register are being set in said auxiliary register.

* * * * *